(12) United States Patent
Mohammad et al.

(10) Patent No.: US 11,340,314 B2
(45) Date of Patent: May 24, 2022

(54) SENSOR, METHOD AND SYSTEM FOR DETECTING ONE OR MORE PROPERTIES OF A MAGNETIC FIELD

(71) Applicant: Intelligent Wellhead Systems Inc., Calgary (CA)

(72) Inventors: Murad Mohammad, St. Albert (CA); Sheldon Kryger, Spruce Grove (CA)

(73) Assignee: INTELLIGENT WELLHEAD SYSTEMS INC., Calgary (CA)

( * ) Notice: Subject to any disclaimer, the term of this patent is extended or adjusted under 35 U.S.C. 154(b) by 0 days.

(21) Appl. No.: 17/050,755

(22) PCT Filed: Apr. 25, 2019

(86) PCT No.: PCT/CA2019/050536
§ 371 (c)(1),
(2) Date: Oct. 26, 2020

(87) PCT Pub. No.: WO2019/204937
PCT Pub. Date: Oct. 31, 2019

(65) Prior Publication Data
US 2021/0239773 A1    Aug. 5, 2021

Related U.S. Application Data

(60) Provisional application No. 62/663,054, filed on Apr. 26, 2018.

(51) Int. Cl.
*G01R 33/04* (2006.01)
*G01K 13/10* (2006.01)
(Continued)

(52) U.S. Cl.
CPC ............ *G01R 33/04* (2013.01); *G01K 13/10* (2013.01); *G01R 33/0011* (2013.01);
(Continued)

(58) Field of Classification Search
CPC .......... G01R 33/00; G01R 33/0035; G01R 33/0023; G01R 33/0017; G01R 31/3191;
(Continued)

(56) References Cited

U.S. PATENT DOCUMENTS

| 2012/0007598 A1* | 1/2012 | Lo ............. G01R 33/07 324/252 |
| 2014/0125330 A1* | 5/2014 | Stanton ........ G01B 7/10 324/229 |

(Continued)

FOREIGN PATENT DOCUMENTS

| JP | 2000019033 A | 1/2000 |
| WO | 2014029030 A1 | 2/2014 |
| WO | 2017205955 A1 | 12/2017 |

OTHER PUBLICATIONS

International Search Report issued in International Application No. PCT/CA2019/050536 dated Jul. 19, 2019 (3 pages).
(Continued)

*Primary Examiner* — Jermele M Hollington
*Assistant Examiner* — Taqi R Nasir
(74) *Attorney, Agent, or Firm* — Osha Bergman Watanabe & Burton LLP

(57) ABSTRACT

The present disclosure relates to a magnetic sensor that comprises a magnetic-sensing element and a magnetic-affecting element. The magnetic sensor is configured for detecting one or more properties, and/or changes therein, of a target magnetic-field. Further embodiments of the present disclosure relate to a sensor unit that houses and protects the magnetic sensor described herein. Further embodiments of the present disclosure relate to a system that comprises the magnetic sensor alone or the sensor unit described herein. Further embodiments of the present disclosure relate to a method for detecting changes in a target magnetic-field. The magnetic sensor described herein comprises a magnetic- (Continued)

sensing element and a magnetic-affecting element. The magnetic-affecting element attracts or attracts and focuses the target magnetic-field through the magnetic-sensing element.

24 Claims, 7 Drawing Sheets

(51) Int. Cl.
G01R 33/00 (2006.01)
G01R 33/02 (2006.01)
G01R 33/038 (2006.01)
G01R 33/07 (2006.01)

(52) U.S. Cl.
CPC ...... *G01R 33/0047* (2013.01); *G01R 33/0206* (2013.01); *G01R 33/038* (2013.01); *G01R 33/07* (2013.01)

(58) Field of Classification Search
CPC ............ G01R 33/04; G01R 33/0011; G01R 33/0047; G01R 33/0206; G01R 33/038; G01R 33/07; G01B 7/004; G01C 17/38; G06F 3/017; G06F 3/0346; G06F 3/012; G01K 13/10
See application file for complete search history.

(56) References Cited

U.S. PATENT DOCUMENTS

2017/0178781 A1* 6/2017 O'Donnell .......... H01F 17/0006
2018/0017635 A1* 1/2018 Guo .................. G01R 33/0029

OTHER PUBLICATIONS

Written Opinion issued in International Application No. PCT/CA2019/050536 dated Jul. 19, 2019 (6 pages).

* cited by examiner

FIG. 2A
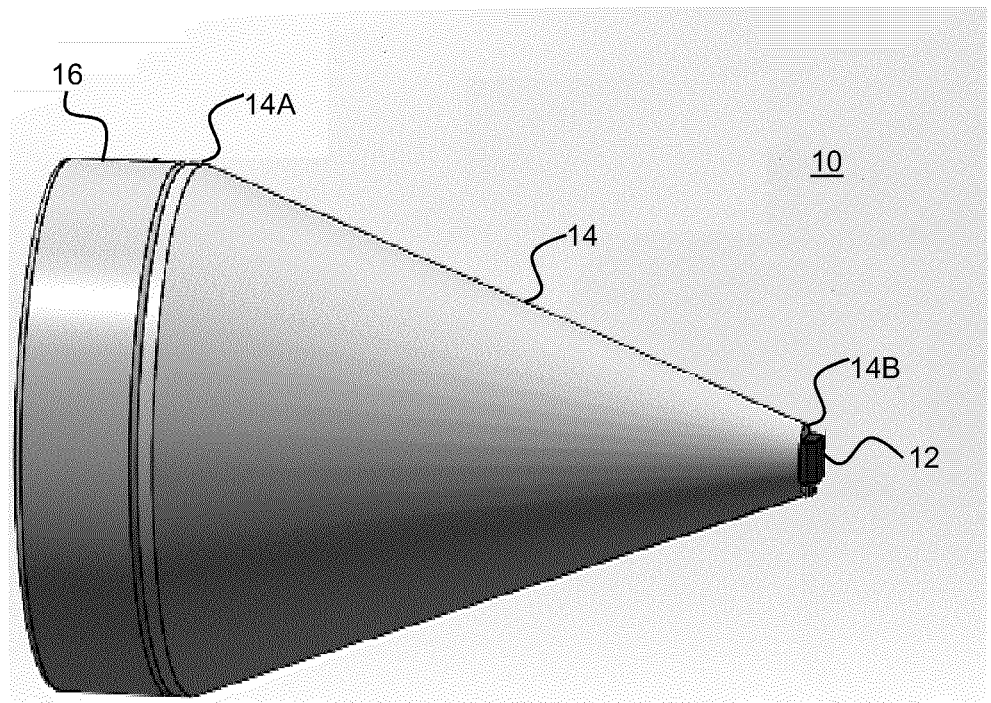
FIG. 2B
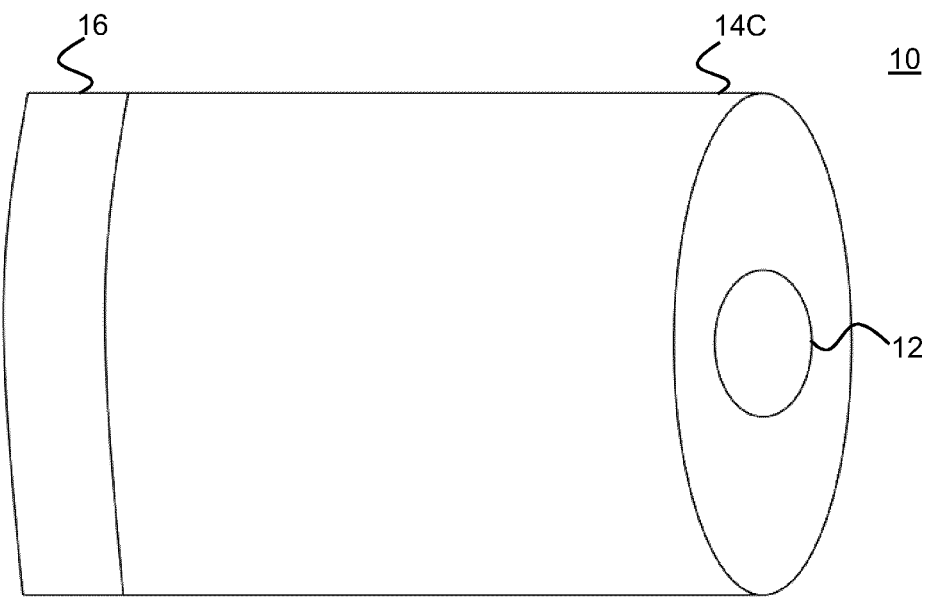
FIG. 2

FIG. 4A
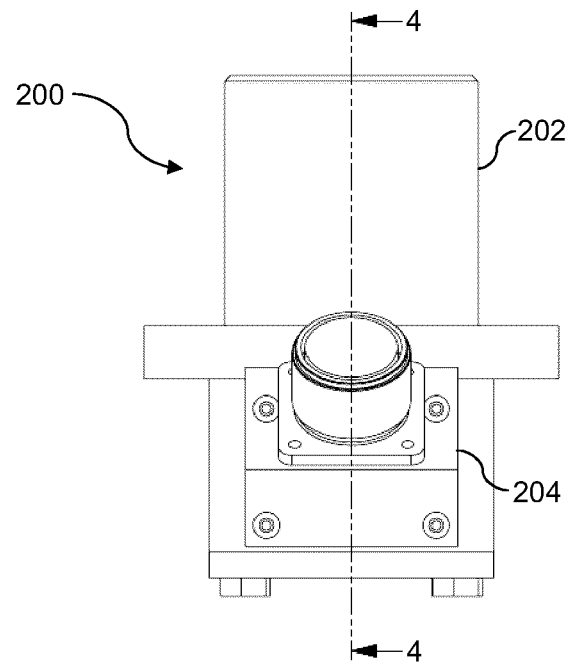
FIG. 4B
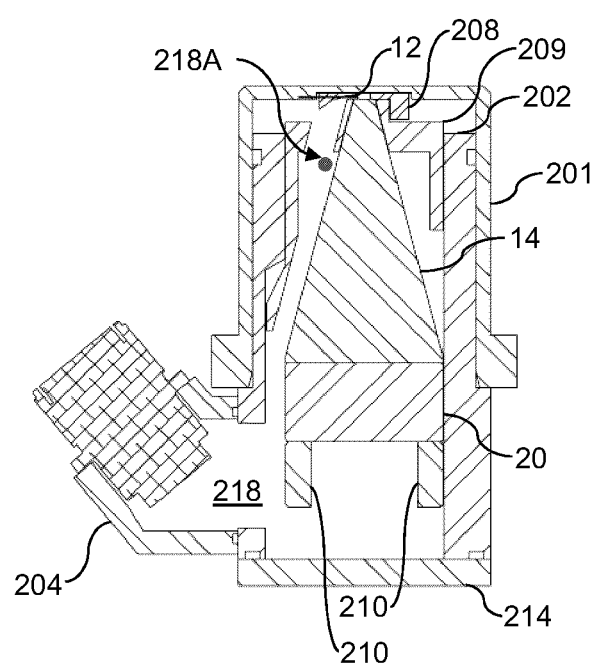
FIG. 4

SENSOR, METHOD AND SYSTEM FOR DETECTING ONE OR MORE PROPERTIES OF A MAGNETIC FIELD

TECHNICAL FIELD

This disclosure generally relates to sensors. In particular, the present disclosure relates to a magnetic sensor, a sensor unit, a method and systems for detecting one or more properties of a magnetic field and changes in those detected properties.

BACKGROUND

Magnetic sensors are used to detect properties and changes in those properties of a magnetic field. Depending on the type of magnetic sensor being used, the detected properties can be one or more of strength of the magnetic field, the direction of the magnetic field and the flux density of the magnetic field.

SUMMARY

Some embodiments of the present disclosure relate to a magnetic sensor that comprises a magnetic-sensing element that is configured for detecting one or more properties of a target magnetic-field and for detecting changes to the one or more properties, and a magnetic-affecting element that is configured for attracting or attracting and focusing the target magnetic-field towards the magnetic-sensing element.

Some embodiments of the present disclosure relate to a method for detecting one or more properties of a target magnetic-field and for detecting changes to the one or more properties, the method comprising steps of: positioning a magnetic-sensing element proximal to or within the target magnetic-field, wherein the magnetic-sensing element is configured for generating an output signal that represents the one or more properties in the target magnetic-field and any changes thereto; and attracting or attracting and focusing the target magnetic-field towards the magnetic-sensing element.

Some embodiments of the present disclosure relate to a system for detecting one or more properties of a target magnetic-field and for detecting changes to the one or more properties. The system comprises a magnetic-sensing element that is configured for detecting one or more properties of a target magnetic-field and for detecting changes to the one or more properties and to generate an output signal that represents the one or more properties and any change thereto in the target magnetic-field. The system also includes a magnetic-affecting element that is configured for attracting or attracting and focusing the target magnetic-field towards the magnetic-sensing element. The system may also include the components of a processor circuit, a memory component and an output device. The processor circuit is operatively coupled to the magnetic-sensing element for receiving the output signal and for generating a second output signal. The memory component is configured for storing the first output signal and/or the second output signal and the output device may be configured for outputting the second output signal.

Without being bound by any particular theory, it is postulated that the magnetic-affecting element attracts or attracts and focuses the target magnetic-field towards the magnetic-sensing element. This influence on the target magnetic-field allows the magnetic-sensing element to better detect the properties of the target magnetic-field and changes in those properties as compared to a magnetic sensor that does not have a magnetic-affecting element. In some embodiments of the present disclosure, the magnetic-affecting element may increase the overall sensitivity of the sensor by increasing the density of the target magnetic-field that the magnetic-sensing element is exposed to.

BRIEF DESCRIPTION OF THE DRAWINGS

The features of the present disclosure will become more apparent in the following detailed description in which reference is made to the appended drawings:

FIG. 2 is two side elevation views of magnetic sensors, wherein FIG. 2A is a magnetic sensor according to one embodiment of the present disclosure, FIG. 2B is a magnetic sensor according to another embodiment of the present disclosure;

FIG. 4 shows further views of the sensor unit in FIG. 3, wherein FIG. 4A shows a front elevation view; and FIG. 4B shows a cross-sectional view taken through line 4-4 in FIG. 4A;

DETAILED DESCRIPTION

Figure 1:
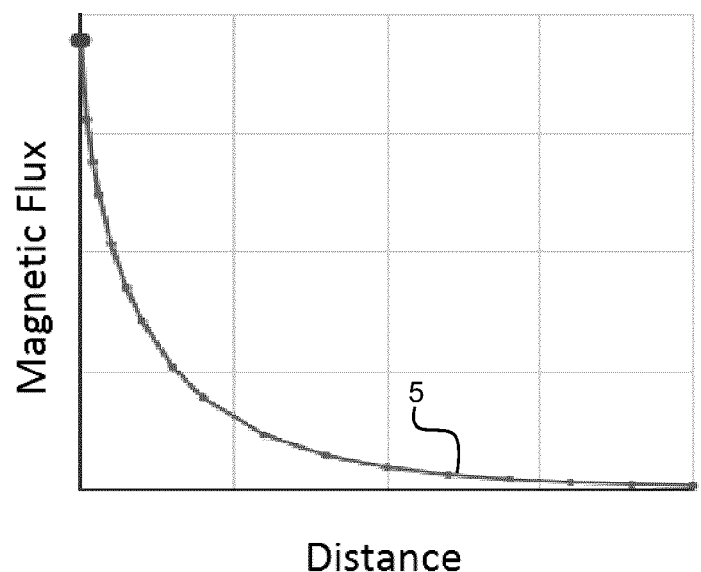
FIG. 1 is a line graph that shows an example of the relationship between magnetic flux at a specific point in space and the distance of that point from the source of magnetic flux.

Some embodiments of the present disclosure relate to a magnetic sensor that comprises a magnetic-sensing element and a magnetic-affecting element. The magnetic sensor is configured for detecting one or more properties, and/or changes therein, of a target magnetic-field. Further embodiments of the present disclosure relate to a sensor unit that houses and protects the magnetic sensor described herein. Further embodiments of the present disclosure relate to a system that comprises the magnetic sensor alone or the sensor unit described herein.

The magnetic sensor of the present disclosure can be positioned proximal to or within the target magnetic-field. The magnetic-field may be generated by a permanent magnet or an electromagnet. Regardless of the source of the target magnetic-field, magnetic field lines may leave one pole (e.g. north pole) of the magnetic source and re-enter the magnetic source through the opposite pole (e.g. south pole). The magnetic sensor of the present disclosure can detect various properties of the target magnetic-field.

For example, the magnetic sensor may detect the returning magnetic field lines that flow through the magnetic-sensing element as part of the return path. Dividing the number of those returning magnetic field lines by the physical area of the magnetic-sensing element that is perpendicular to the direction of the field lines provides an indication of the magnetic flux density at the location of the magnetic-sensing element. Since there are infinite return paths for the magnetic field with some of them being less magnetically resistant than others, the magnetic-sensing element will only experience a fraction of the target magnetic-field depending upon its position.

Various factors may perturb one or more properties of a target magnetic-field for example, a ferrous body passing through the target magnetic-field. The ferrous body may alter the return paths of the magnetic field lines, which alters the detected flux density of the magnetic-sensing elements. However, since the magnetic-sensing elements are only exposed to a portion of all of the magnetic field lines, the change caused by a ferrous body will also be a small fraction of the overall change and it will be dependent upon the position of the magnetic-sensing elements and the materials that surround it.

Without being bound by any particular theory, the magnetic return path through the magnetic sensing-element's magnetic resistivity may be lowered, which will cause a larger percentage of the return magnetic field lines to pass through the magnetic sensing-element. This means that when a ferrous body passes through or near to the target magnetic-field a larger fraction of the perturbation caused by the ferrous body will be detected by the magnetic-sensing element. To achieve this the magnetic-affecting element is used. The magnetic-affecting element attracts the target magnetic-field through the magnetic sensing-element by lowering the resistivity to the return magnetic field lines.

In some embodiments of the present disclosure, the shape of the magnetic magnetic-affecting element controls the resistivity of the return path. In other words, the shape of the magnetic-affecting element may influence how much of the target magnetic-field it attracts, and what percentage of the target magnetic-field is focused through the magnetic-sensing element.

Definitions

Unless defined otherwise, all technical and scientific terms used herein have the same meaning as commonly understood by one of ordinary skill in the art to which this disclosure belongs.

As used herein, the term "about" refers to an approximately +/−10% variation from a given value. It is to be understood that such a variation is always included in any given value provided herein, whether or not it is specifically referred to.

As used herein, the term "amplitude" describes the difference between the lowest value of a specific outcome that is being measured and the highest value of the same outcome.

As used herein, the term "ferromagnetic" describes the properties of a material that allow that material to be attracted to a magnet and/or be converted into a permanent magnet. For clarity, ferromagnetic materials described herein are not limited to materials that contain iron.

As used herein, the term "ferromagnetism" describes the mechanism by which materials respond to a magnetic field. For clarity, ferromagnetism includes ferrimagnetism, paramagnetism, diamagnetism and antiferromagnetism.

As used herein, the term "magnetic field" describes a field of force with a magnitude and direction that is created by moving magnetic dipoles and/or moving electric charges and exerts force on other nearby magnetic dipoles and/or electric charges.

As used herein, the term "magnetic field strength" is a property of a magnetic field that describes a magnitude of the magnetic field and the force it exerts on nearby magnetic dipoles or electric charges.

As used herein, the term "magnetic flux" is a property of a magnetic that describes a measurement of the magnitude of the total magnetic field that is passing through a unit area.

As used herein, the term "magnetic flux density" is a property of a magnetic that describes the amount of magnetic flux that passes through a unit area perpendicular to the magnetic field lines of the magnetic field.

As used herein, the term "magnitude" describes a detectable value of a specific outcome that is being measured at a given point in time.

As used herein, the term "target magnitude-field" is used to refer to the magnetic field that the magnetic sensor described in the present disclosure is designed to measure one or more properties of and/or changes in one or more properties of the magnetic field.

Embodiments of the present disclosure will now be described by reference to FIG. 1 to FIG. 7.

Embodiments of the present disclosure relate a sensor, a method and a system for detecting one or more properties within a magnetic field and for detecting changes in those detected properties. The changes in the properties of the magnetic field can arise as a body passes through or in sufficiently close proximity to the magnetic field so that one or more properties of the magnetic field are perturbed.

FIG. 1 is a line graph that shows the relationship 5 between the magnitude of magnetic flux of a magnetic field that is measured at various distances from the source of the field. Without being bound by any particular theory, as the distance from the source of the magnetic field increases, the magnitude of the magnetic flux decreases.

FIG. 2A and FIG. 2B each show one embodiment of a magnetic sensor 10 that comprises a magnetic-sensing element 12 and a magnetic-affecting element 14. The magnetic sensor 10 can be used in any application where it is desired to detect one or more properties of a magnetic field that is external to the magnetic sensor 10 and to detect changes in those properties. For example, the magnetic sensor 10 can be used to detect the magnetic flux of a magnetic field and to detect changes in the magnetic flux of that magnetic field. As will be discussed further below, at least one difference between the embodiments shown in FIG. 2A and FIG. 2B is that magnetic sensor 10 has the magnetic-affecting element 14 with a frustoconical shape and the magnetic sensor 10A has the magnetic-affecting element 14 with a cylindrical shape. The magnetic-sensing element 12 in both the magnetic sensors 10, 10A can be the same or not.

In some embodiments of the present disclosure, the sensing element 12 is configured for detecting one or more properties of a magnetic field. In some embodiments of the present disclosure the sensing element 12 is configured for detecting changes in one or more properties of a magnetic field over time. For example, the sensing element 12 can detect fluctuations, which are also referred to as changes, in magnetic flux of the magnetic field and/or changes in the direction of the magnetic field. The sensing element 12 can be one or more of the following types of sensing elements, such as a Hall Effect sensor, a microelectromechanical systems (MEMS) magnetic field sensor, a magneto-diode, a magneto-transistor, an anisotropic magnetoresistance magnetometer, a giant magnetoresistance magnetometer, a magnetic tunnel junction magnetometer, a magneto-optical sensor, a Lorentz force based MEMS sensor, an electron tunneling based MEMS sensor, a MEMS compass, an optically pumped, magnetic field sensor, a fluxgate magnetometer, and a superconducting quantum interference magnetometer device.

The sensing element 12 is also configured for reporting the detected change in one or more properties of the magnetic field by generating an output signal. The output signal can be optical, digital, analogue or some other form of signal is transmitted (wired or wirelessly) to an output device (not shown). The output signal corresponds to the magnitude or direction of the detected change in the magnetic field. For example, the output signal may be an output voltage. A given voltage of the output signal may reflect the amplitude of a given property of the magnetic field, for example the magnitude of the flux density of the magnetic field at a given position. No change in the output signal which could indicate a substantially constant property of magnetic field that the sensing element 12 is configured for detecting over the relevant time period. A change in the output voltage reflects a change in the detected property that may be due to either a change in the magnetic field source or a change in the environment that the magnetic field passes through and that is detectable by the sensor. For example if the change indicates a reduction in the magnetic field, this may mean that the magnetic field source has reduced its output strength or it may indicate that the magnetic field source has changed its direction or position relative to the sensor. Alternatively the change may be a result of a ferromagnetic object that is proximal to or within the magnetic field has changed its position.

In some embodiments of the present disclosure the sensing element 12 is configured for measuring the magnetic flux and/or the magnetic flux density that is present in the same physical area as the sensing element 12. The sensing element 12 may also be configured for detecting the direction of the magnetic field, either in addition to the magnetic flux and/or the magnetic flux density, or not.

In some embodiments of the present disclosure the magnetic-affecting element 14 has a first end 14A and a second end 14B. The first end 14A is configured for connecting to a mount 16 for mounting the magnetic sensor 10 within or upon a housing (as discussed further herein below). The sensing element 12 can be coupled to the magnetic-affecting element 14 proximal the second end 14B. In some embodiments of the present disclosure the magnetic-affecting element 14 is made of a ferromagnetic material or ferromagnetic material. Examples of ferromagnetic materials include, but not limited to: iron, nickel, cobalt, an iron alloy, a nickel alloy, a cobalt alloy, iron-based materials, nickel-based material, cobalt-based materials, or combinations thereof. While FIGS. 2A and 2B each show a non-limiting example of the magnetic sensor 10 it is understood that the magnetic-affecting elements 14, 14C may take different shapes. For example, the magnetic-affecting elements 14, 14C can be frustoconical with different cross-sectional diameter at each end, cylindrical with a substantially constant cross-sectional diameter or it can take any other polygonal shape when viewed in cross-section. In some embodiments of the present disclosure it may be preferred that the magnetic-affecting element 14, 14C has a shape where the second end 14B is approximately the same or substantially the same cross-sectional size as the sensing element 12.

The ferromagnetic materials of the magnetic-affecting element 14, 14C can attract at least a portion of the magnetic field toward the magnetic-affecting element 14, 14C, which in turn may attract the substantially the same portion or a part of the same portion of the magnetic field towards the sensing element 12. Without being bound by any particular theory, the magnetic-affecting element's 14, 14C attraction of the portion magnetic field focuses the magnetic field towards the sensing element 12 and that focus may provide an increased sensitivity and/or resolution of the magnetic sensor 10. In particular, the shape of the magnetic-affecting element 14 may provide an increased focus of the target magnetic-field through the magnetic-sensing element. An increased sensitivity of the magnetic sensor 10 allows for detecting and reporting smaller absolute levels of the detected properties of the magnetic field. An increased resolution allows the magnetic sensor 10 to detect and report smaller relative changes of the detected properties of the target magnetic-field.

In some embodiments of the present disclosure, the magnetic-affecting element 14, 14C may allow the magnetic sensor 10 to detect smaller perturbations of the properties of the magnetic field than the sensing element 12 would be able to detect without the magnetic-affecting element 14. For example, if a ferromagnetic body approaches, is moving through and/or moving away from the magnetic field, that will perturb the magnetic field in various way. The perturbations of the magnetic field will be evidenced by detected changes in one or more properties of the magnetic field at the position where the sensor 10 is located. That perturbation of the magnetic field will allow the sensing element 12 to generate an output signal that will report the perturbation of the magnetic field caused by the ferromagnetic body. In some applications, reporting a perturbation of a magnetic field is useful to know when a ferromagnetic body is approaching, moving through and/or moving away from the magnetic field.

Figure 3:
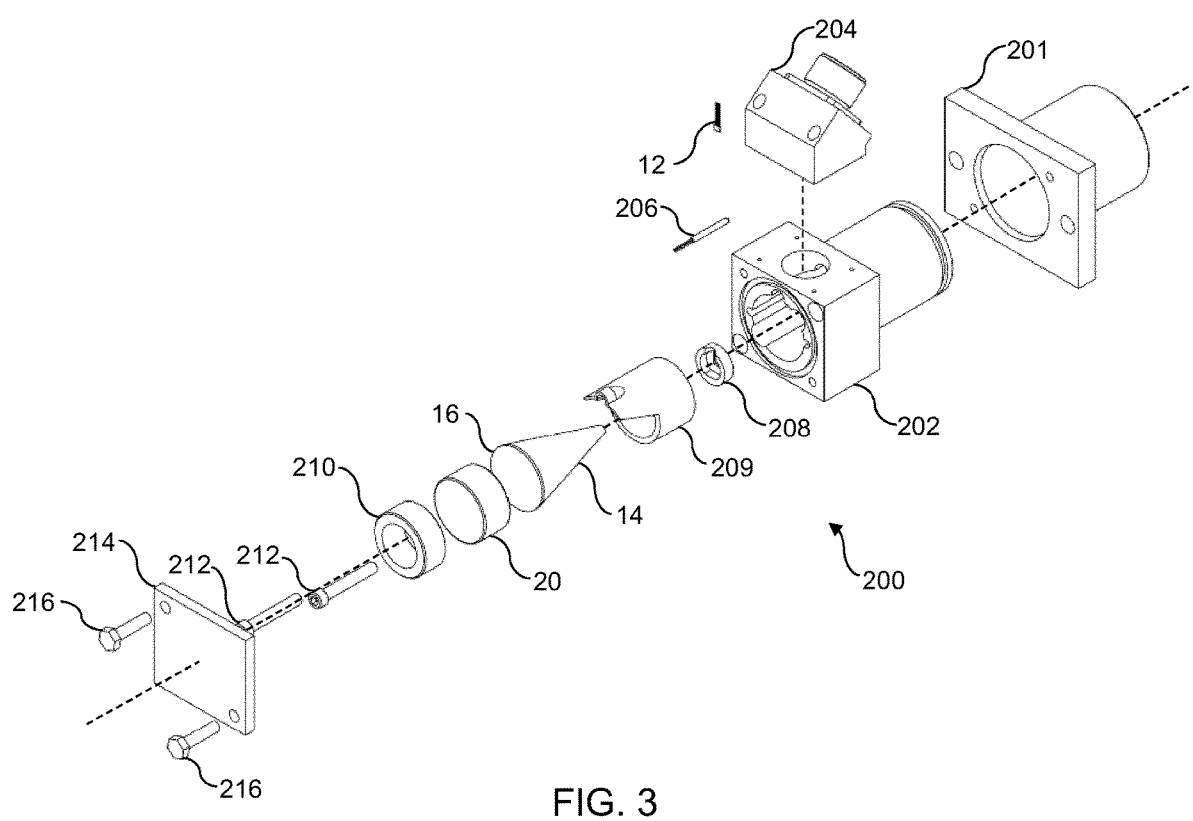
FIG. 3 is an isometric, exploded view of one embodiment of a sensor unit that can use embodiments of a magnetic sensor according to the present disclosure.

In some embodiments of the present disclosure the magnetic sensor 10 may include a secondary magnet 20 that is positioned at or proximal to the first end 14A of the magnetic-affecting element 14 (see FIG. 3). The secondary magnet 20 may be oriented so that the magnetic field direction of the secondary magnet 20 may attract or repel more of the target magnetic-field. In some embodiments of the present disclosure, the secondary magnet 20 is oriented to repel at least a portion of the target magnetic-field away from the magnetic-sensing element 12. In other embodiments of the present disclosure the secondary magnet 20 is oriented to attract at least a further portion of the target magnetic-field towards and through the magnetic-sensing element 12 than is otherwise attracted towards and through the magnetic-sensing element 12. For example, the secondary magnet 20 may increase the density of the target magnetic-field that is passing through the magnetic-sensing element 12, which may in turn increase the overall sensitivity of the magnetic sensor 10.

Variations in temperature may affect the magnetic field source and/or the magnetic sensor 10. For example, if the magnetic field source is a permanent rare-earth magnet variations in the local temperature may affect the magnetic field generated by the magnetic field source. Furthermore, some types of magnetic sensing elements 12 may also be affected by temperature variations, for example Hall Effect sensors are known to be affected by temperature variations.

Furthermore, temperature variations may cause changes in the physical dimensions of the magnetic-effecting element 14 because of thermal expansion and contraction, this may affect the behaviour of the magnetic circuit and thus the output of the magnetic sensor 10 as well.

In some embodiments of the present disclosure the magnetic sensor 10 may include a temperature sensor 206 (shown in FIG. 3). The temperature sensor 206 is configured for generating a temperature output signal that indicates the temperature near, at or about the magnetic sensor 10. The temperature output signal can be used to calibrate, compensate and/or account for variations in temperature which may improve the accuracy of the magnetic sensor's 10 output signal. The temperature sensor 206 can be a resistive temperature diode, a thermistor, a thermocouple or any other type temperature sensor 206 that is suitable for the application in which the magnetic sensor 10 is being used.

In some embodiments of the present disclosure, the increased sensitivity of the magnetic sensor 10 may result in the sensor 10 being susceptible to external forces, such as fluctuations in temperature, vibration or other mechanical forces that may change the relative distance between the components of the magnetic sensor 10. In order to protect the magnetic sensor 10 from such external factors, the magnetic sensor 10 may be incorporated into a sensor unit 200.

FIG. 3 shows one embodiment of the present disclosure that relates to the sensor unit 200 that is configured for housing and protecting the magnetic sensor 10. The sensor unit 200 may comprise the magnetic sensor 10 with the magnetic-sensing element 12, the magnetic-influencing element 14 and optionally, a magnet 20. The magnetic sensor 10 may also include an optional temperature sensor 206. The sensor unit 200 may also comprise various components for housing and protecting the magnetic sensor 10 such as an external housing 201, an internal housing 202, a connector 204, a sensor retainer 208, an element retainer 209, a spacer 210, one or more internal fasteners 212, a plate 214 and one or more external fasteners 216. FIG. 4A shows the sensor unit 200 assembled and FIG. 4B shows a cross-sectional view of the sensor unit 200. When assembled, the sensor unit 200 defines an internal plenum 218, in which the magnetic sensor 10 is housed. The internal plenum 218 can provide a route for any wires from the magnetic-sensing element 12 and the optional temperature sensor 206 to conduct through the sensor unit 200.

In some embodiments of the present disclosure, the internal plenum 218 is filled with a potting material 218A to protect the magnetic sensor 10. The potting compound 218A may be selected based upon its physical properties. For example, the potting agent 218A may be fluid in a first phase when it is introduced into the internal plenum 218 and then harden into a more solid second phase that is positioned about the magnetic sensor 10. While FIG. 4B only shows a single dot to represent the potting agent 218A, the skilled person will appreciate that some, substantially all or all of the plenum 218 can be filled with potting agent 218A about the magnetic sensor 10. The potting agent 218A may be stable or predictably expandable within the temperature span that the magnetic sensor 10 is going to be used in. The potting agent 218A may also be dielectric so that it doesn't interfere with the various electrical connections within the sensor unit 200. When in the second phase, the potting agent 218A may be hard enough to improve the mechanical stability of the magnetic sensor 10 from any vibration or impact. The potting agent 218A also should not otherwise interfere with the magnetic-field detection functionality of the magnetic sensor 10 as described herein. Some non-limiting examples of suitable potting agents 218A include epoxy, silicone, urethane or combinations thereof.

It is understood by the skilled person that the embodiment shown in FIG. 3 and FIG. 4 is merely one example of a sensor unit 200 that can be used to house the magnetic sensor 10. For example, the sensor stacks 124 described herein below may utilize the sensor unit 200 or different components that house and protect the magnetic sensor 10. The design choice of the housing and protective components of the sensor unit 200 that protect the magnetic sensor 10 can be varied in a number of different manners depending upon the application in which the magnetic sensor 10 is being used.

EXAMPLES

The magnetic sensor 10 described herein can be used in various applications, including, but not limited to: a compass, a linear and angular sensing device, a rotational velocity monitoring device, a contactless current sensing device, a metal detection device, a proximity sensing device, an underground power-line locator device, a thickness measuring device for use with metals and alloys.

Figure 5:
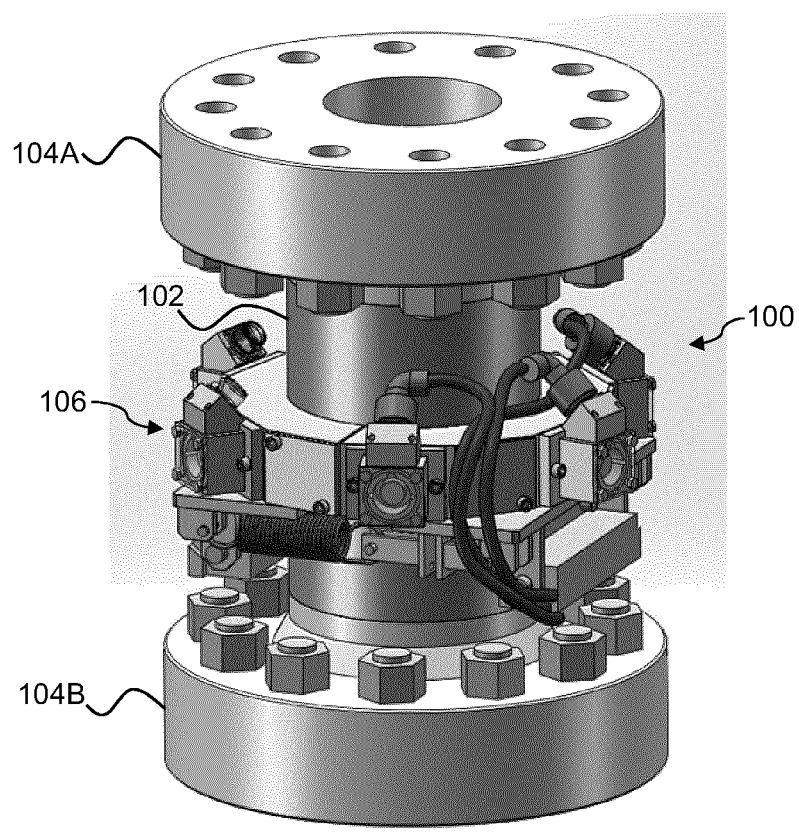
FIG. 5 is an isometric, side-elevation view of a tool that can use embodiments of a magnetic sensor according to the present disclosure.
Figure 6:
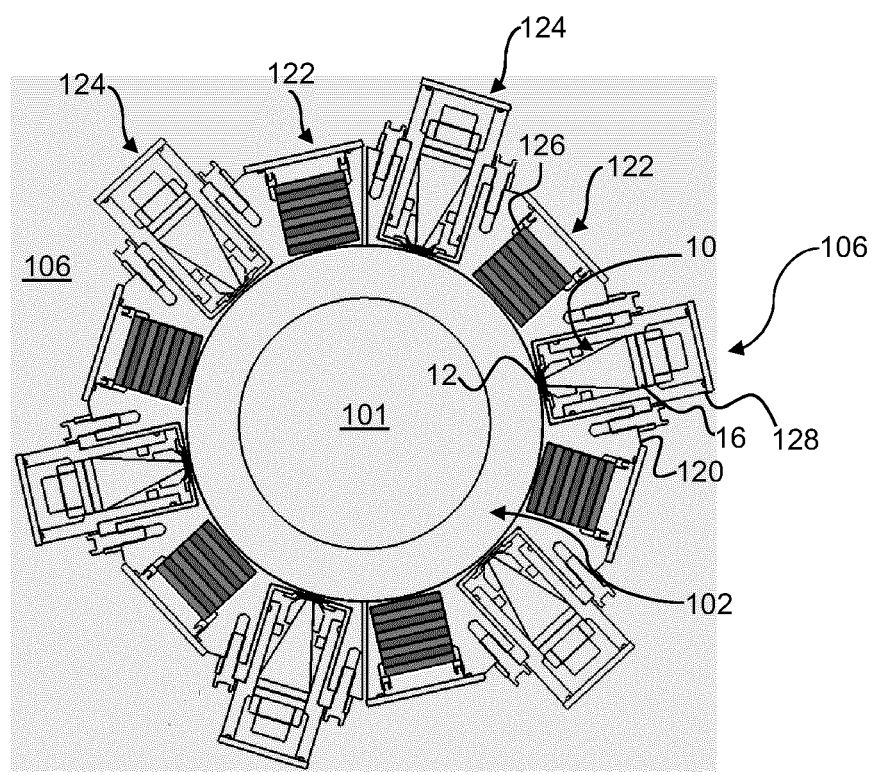
FIG. 6 is a top-plan, cross-sectional view of the tool shown in FIG. 5 with multiple magnetic sensors used therein according to one embodiment of the present disclosure.

FIG. 5 and FIG. 6 show part of a system 100 in which the magnetic sensor 10 can be used. The system 100 includes a tubular 102, two end flanges 104A, 104B and a magnetic array 106. In some embodiment of the present disclosure, the tubular 102 can define a central bore 101 by one or more side walls that are made from a non-ferromagnetic material. For the purposes of this disclosure, anon-ferromagnetic material is a material that is not a magnet, not affected by the presence of a magnetic field and/or that does not perturb the properties of a magnetic field. Various non-ferromagnetic materials may be suitable, including but not limited to copper, lead, tin, titanium, zone and alloys thereof.

In some embodiments of the present disclosure, the two end flanges 104A, 104B can be made of magnetic or non-ferromagnetic materials. In some embodiments of the present disclosure the two end flanges 104A, 104B can be made of the same material, or not. In some embodiments of the present disclosure the two end flanges 104A, 104B are both made of a magnetic material. In some embodiments of the present disclosure, the two end flanges 104A, 104B are configured for allowing the system 100 to be incorporated into an oil and/or gas well (not shown) above the surface into which the well extends. For clarity, the surface into which the well extends may be above or below the surface of a body of water. When the system 100 is incorporated into an oil and/or gas well, the tubular 102 may be in fluid communication with a wellbore of the well. In some embodiments of the present disclosure the central bore 101 of the tubular 102 is aligned with the wellbore so that objects and fluids that move through the wellbore can also move through the central bore 101.

The magnetic array 106 can include an array body 120, one or more magnetic stacks 122 and one or more sensor stacks 124. The array body 120 can be shaped so that it can be positioned about a portion of the tubular 102. For example, the one or more stacks 122, 124 can be coupled to the array body 22 so that the stacks 122, 124 are positioned about the tubular 102. In some embodiments of the present disclosure, the magnetic array 106 includes more than one magnetic stacks 122 and more than one sensor stacks 124. In some embodiments of the present disclosure the magnetic stacks 122 are positioned between each of the sensor stacks 124 so that the stacks 122, 124 are arranged in an alternating pattern (as shown in FIG. 4).

Each of the one or more magnetic stacks 122 include one or more magnets 126 that generate one or more magnetic fields (individual or collectively a target magnetic-field) that extend across the central bore 101 and the tubular 102 where the magnetic array 106 is positioned. The magnets 126 can be an electromagnet, a rare earth magnet or a magnetized ferromagnetic material.

Each of the one or more sensor stacks 124 comprise a housing 128 for housing one or more sensors 10. In some embodiments of the present disclosure the sensors 10 are positioned so that the sensing-element 12 is oriented towards the central bore 101. In some embodiments of the present disclosure, the sensor stack 124 may include a sensor stack magnet (not shown). In some embodiments of the present disclosure each sensor stack 124 is configured for detecting a different property of the magnetic field. In other embodiments of the present disclosure more than one sensor stack 124 is configured for detecting the same property of the magnetic field.

In operation, a ferromagnetic body (not shown) may approach, move through and move away from the target magnetic-field generated by the one or more magnetic stacks 122. This movement of the ferromagnetic body will perturb one or more properties of the target magnetic-field, which will be detected by the one or more sensor stacks 124. The sensors 10 will generate an output signal that is transmitted to an output device for use by a user.

Figure 7:
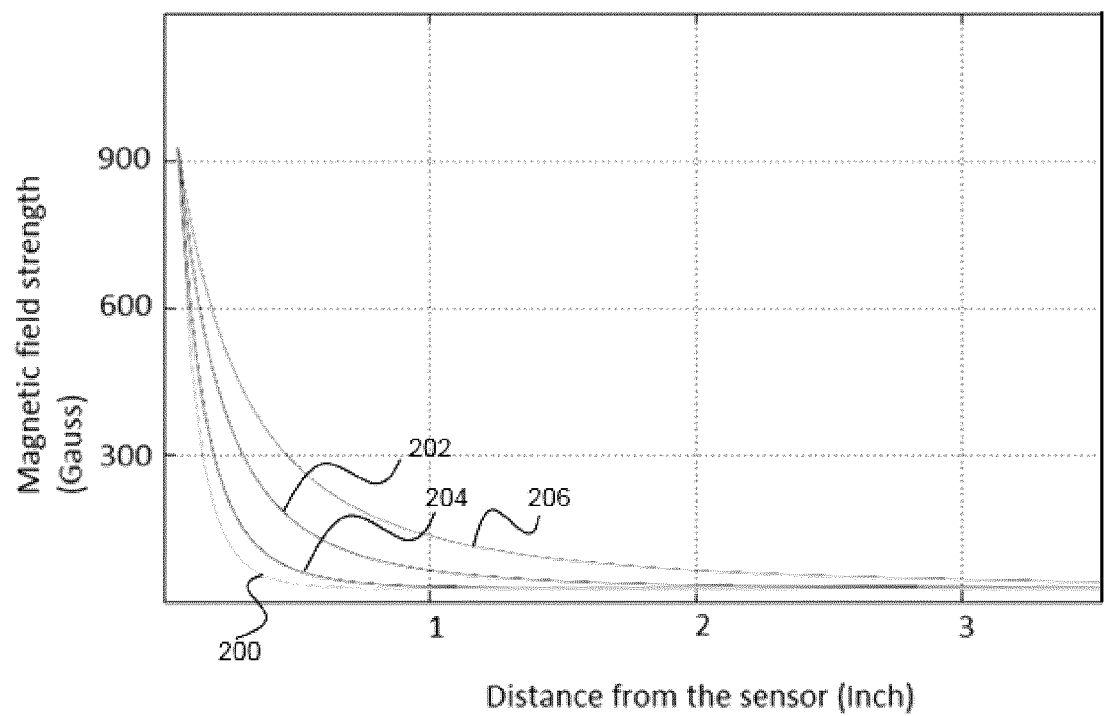
FIG. 7 is a line graph that show examples of simulated magnetic flux density measurements based when a magnet is moving away from one of four types of magnetic sensors.

FIG. 7 shows simulated magnetic field strength measurements (Gauss) where a magnet (and therefore the target magnetic-field) is moving away from one of four types of magnetic sensors. The change in the magnetic field read by the sensor indicates the sensitivity of the sensor and its ability to attract more magnetic field. Sensor 1 contains a magnetic-sensing element without any magnetic-affecting element (green curve 200). Sensor 2 contains a frustoconically shaped magnetic-affecting element (blue curve 202), sensor 3 contains a cylindrically shaped magnetic-affecting (black curve). Sensor 4 is sensor 2 with a magnet placed to attract more magnetic field through the magnetic-sensing element (red curve 206).

As shown in FIG. 7 as the magnet moves away from the sensor, the detected magnetic field drops drastically. However at the distances greater than 1 inch, the greatest change in magnetic field strength per change in distance is observed with sensor 4. The performance of sensor 4 is followed by sensor 2, then sensor 3, and finally sensor 1. This performance also indicate the order of sensitivity—from highest to lowest—of the sensors 4, 2, 3 and 1, respectively, because this performance reflects the ability to detect changes in further and weaker magnetic fields.

We claim:

1. A magnetic sensor comprising:
  a magnetic-sensing element that is configured for detecting one or more properties of a target magnetic-field and detecting any changes in said one or more properties; and
  a frustoconically shaped magnetic-affecting element that is configured for attracting at least a portion of the target magnetic-field towards the magnetic-sensing element.

2. The magnetic sensor of claim 1, wherein the frustoconically shaped magnetic-affecting element is configured for focusing the at least a portion of the target magnetic-field towards the magnetic-sensing element.

3. The magnetic sensor of claim 1, wherein the frustoconically shaped magnetic-affecting element has a first end and a second end and the magnetic-sensing element is coupled to the first end.

4. The magnetic sensor of claim 1, wherein the frustoconically shaped magnetic-affecting element is at least partially comprised of a ferromagnetic material.

5. The magnetic sensor of claim 3, wherein the first end of the frustoconically shaped magnetic-affecting element has a first cross-sectional area that is substantially equal to a cross-sectional area of the magnetic-sensing element.

6. The magnetic sensor of claim 3, wherein the second end is configured for coupling the magnetic sensor to a base.

7. The magnetic sensor of claim 3, further comprising a magnet positioned proximal to the second end.

8. The magnetic sensor of claim 2, further comprising a temperature sensor.

9. The magnetic sensor of claim 1, wherein the magnetic-sensing element is configured for generating an output signal that represents one or more properties of the target magnetic-field.

10. The magnetic sensor of claim 1, wherein the magnetic-sensing element is configured for generating an output signal that represents any changes in one or more properties of the target magnetic-field.

11. The magnetic sensor of claim 1, wherein the magnetic-sensing element is configured for detecting changes in magnetic flux of the target magnetic-field.

12. A sensor unit comprising a housing that is configured for housing the magnetic sensor of claim 1.

13. The sensor unit of claim 12, wherein the housing defines an internal plenum in which the magnetic sensor is housed.

14. The sensor unit of claim 13, further comprising a potting agent positioned within the internal plenum.

15. A method for detecting changes in a target magnetic-field, the method comprising steps of:
  positioning a magnetic-sensing element proximal to or within the target magnetic-field, wherein the magnetic-sensing element is configured for generating an output signal that represents one or more properties of the target magnetic-field and that represents a change in the one or more properties; and
  attracting at least a portion of the target magnetic-field towards the magnetic-sensing element by a frustoconically shaped magnetic-affecting element.

16. The method of claim 15, further comprising focusing the target magnetic-field towards the magnetic-sensing element.

17. A system for detecting changes in a target magnetic-field, the system comprising:
  a magnetic-sensing element that is configured for detecting changes in the target magnetic-field and for generating an output signal that represents a change in the target magnetic-field;
  a frustoconically shaped magnetic-affecting element that is configured for attracting at least a portion of the target magnetic-field towards the magnetic-sensing element; and
  a processor circuit that is operatively coupled to the magnetic-sensing element and that is configured for receiving the output signal and for generating a second output signal.

18. The system of claim 17, wherein the frustoconically shaped magnetic-affecting element is configured for focusing the at least a portion of the target magnetic-field towards the magnetic-sensing element.

19. The system of claim 17, further comprising a memory component that is configured for storing the output signal and/or the second output signal.

20. The system of claim 17, further comprising an output device that is configured for outputting the second output signal.

21. The system of claim 17, further comprising a secondary magnet positioned at or proximal to one end of the frustoconically shaped magnetic-affecting element.

22. The system of claim 21, wherein the secondary magnet is positioned at a first end of the frustoconically shaped magnetic-affecting element and the magnetic-sensing element is positioned at an opposite second end of the frustoconically shaped magnetic-affecting element.

23. The system of claim 21, wherein the secondary magnet is oriented for attracting a further portion of the target magnetic-field through the magnetic-sensing element.

24. The system of claim 21, wherein the secondary magnet is oriented for repelling at least a portion of the target magnetic-field away from the magnetic-sensing element.

\* \* \* \* \*